United States Patent
Mohapatra et al.

(10) Patent No.: US 7,858,513 B2
(45) Date of Patent: Dec. 28, 2010

(54) FABRICATION OF SELF-ALIGNED VIA HOLES IN POLYMER THIN FILMS

(75) Inventors: Siddharth Mohapatra, Federal Way, WA (US); Klaus Dimmler, Colorado Springs, CO (US); Patrick H Jenkins, Colorado Springs, CO (US)

(73) Assignee: OrganicID, Inc., Colorado Springs, CO (US)

( * ) Notice: Subject to any disclaimer, the term of this patent is extended or adjusted under 35 U.S.C. 154(b) by 755 days.

(21) Appl. No.: 11/764,326

(22) Filed: Jun. 18, 2007

(65) Prior Publication Data

US 2008/0311698 A1  Dec. 18, 2008

(51) Int. Cl.
*H01L 21/4763* (2006.01)

(52) U.S. Cl. ............... 438/622; 438/623; 438/624; 438/625; 438/626

(58) Field of Classification Search .......... 438/622–626
See application file for complete search history.

(56) References Cited

U.S. PATENT DOCUMENTS

| | | | |
|---|---|---|---|
| 5,130,274 A * | 7/1992 | Harper et al. ............... 438/624 |
| 6,015,751 A | 1/2000 | Liu | |
| 6,091,152 A * | 7/2000 | Iwata .......................... 257/770 |
| 6,159,839 A | 12/2000 | Jeng et al. | |
| 6,187,668 B1 | 2/2001 | Wu et al. | |
| 6,635,566 B1 * | 10/2003 | Blosse et al. ................ 438/638 |
| 6,723,631 B2 * | 4/2004 | Noguchi et al. ............. 438/618 |
| 6,943,067 B2 * | 9/2005 | Greenlaw ................... 438/152 |
| 6,987,031 B2 * | 1/2006 | Eng et al. .................... 438/108 |
| 7,084,479 B2 * | 8/2006 | Chen et al. .................. 257/522 |
| 7,250,365 B2 * | 7/2007 | Arai et al. ................... 438/625 |
| 2002/0047207 A1 * | 4/2002 | Sekiguchi ................... 257/758 |
| 2002/0127844 A1 * | 9/2002 | Grill et al. .................. 438/622 |
| 2002/0149110 A1 * | 10/2002 | Ahn et al. .................... 257/758 |
| 2004/0099951 A1 * | 5/2004 | Park et al. ................... 257/758 |
| 2004/0099952 A1 * | 5/2004 | Goodner et al. ............. 257/758 |
| 2006/0094178 A1 | 5/2006 | Lin et al. | |
| 2007/0020798 A1 | 1/2007 | Wu et al. | |

FOREIGN PATENT DOCUMENTS

| | | |
|---|---|---|
| CN | 1464767 | 12/2003 |
| CN | 1744342 | 3/2006 |
| KR | 100659112 | 12/2006 |
| WO | 98/39781 | 9/1989 |

* cited by examiner

*Primary Examiner*—Matthew C Landau
*Assistant Examiner*—James M Mitchell

(57) ABSTRACT

A low-cost and efficient process produces self-aligned vias in dielectric polymer films that provides electrical connection between a top conductor and a bottom conductor. The process is achieved by printing conductive posts on the first patterned conductive layer, followed by the deposition of an unpatterned layer dielectric, followed by the deposition of a second patterned conductive layer. The vias are formed during the flash annealing of the post after the dielectric is deposited, but before the second conductive layer is deposited. In this process, the post material is annealed with a flash of light, resulting in a release of energy which removes the dielectric on the top of the post.

14 Claims, 18 Drawing Sheets

FABRICATION OF SELF-ALIGNED VIA HOLES IN POLYMER THIN FILMS

FIELD OF INVENTION

The present invention relates to organic transistors used in printed circuits and, more particularly to a method of fabricating via holes in polymer dielectrics to connect one conductive layer with another.

DESCRIPTION OF RELATED ART

Organic field-effect transistors (oFETs) have been proposed for a number of applications including displays, electronic barcodes and sensors. Low cost processes, large-area circuits and the chemically active nature of organic materials are the chief driving forces to make oFETs important in various applications. Many of these objectives depend on a method of fabrication utilizing printing techniques such as flexography, gravure, silk screen and inkjet printing.

Printed top gate and bottom gate structured transistors and circuits have been demonstrated in the past. Usually, such a system consists of printed semiconductor, dielectric and gate conductors on flexible substrates.

Referring now to FIG. 1, a cross-sectional diagram of a top-gate bottom contact organic MIS transistor 100 is shown. Two conductor regions 101 and 102 for the transistor source and drain are deposited and patterned on insulating substrate 112. The gap between conductive regions 101 and 102 is known as the "channel", and is designated as 103 in FIG. 1. A semiconductor layer 104 is deposited on the conductive regions 101 and 102. This semiconductor layer must overlap the channel 103, but may or may not exist in other areas of the transistor. In FIG. 1, the semiconductor has not been removed.

A thin film of dielectric material 106 is deposited on top of semiconductor layer 104 and source 101 and drain 102. The dielectric 106 may or may not be deposited in other areas as well. However, the dielectric 106 may not exist in any areas where the source or drain is to connect to conductive traces on top of the dielectric.

A conductive film 108 is deposited and patterned on top of dielectric 106 to form the gate of a transistor, which must completely overlap the channel region 103. This conductive layer may also be patterned in other areas, which serve as appropriate connections between transistors. This conductive layer 108 must make contact to the source/drain layer 101/102 as specified by the associated circuit design. Referring to the example in FIG. 1, source 101 makes contact to conductive layer 110 and drain 102 makes contact to conductive layer 111. Depending on circuit configuration, it is also possible that electrical connections are made between the source/drain conductive layer to the gate layer 108 where the metal on the source/drain layer 101/102 is not necessarily used as a source or drain of a transistor, but rather an interconnect.

The holes 113 and 114 that electrically connect the gate conductive layer to the source-drain conductive layer are called "vias". In the prior art, these holes may be created by not depositing the dielectric in those areas by use of a stamp or a shadow mask. Alternatively, subtractive processes such as photolithography followed by etching by chemical, physical, or reactive ion means have been used for defining vias.

Patterning requires precise alignments so that the vias are precisely aligned with the conductor above the dielectric and below the dielectric to make good electrical contact. In addition, non-uniformity in the dielectric will result in unreliable isolation of the conductive layers above and below the dielectric, resulting in undesired electrical connections.

In some cases, when features having two different shapes are printed close to each other, one printed area may scavenge material from the other leading to an uneven distribution of material compromising uniformity. These undesirable phenomena are exacerbated with the increasing complexity of the circuits that require printing of a larger number of smaller features.

What is desired, therefore, is a practical scalable process utilizing low cost printing techniques that can circumvent the described limitations of the prior art to provide electrical contact between the gate metal layer and the source/drain metal layer in a printed organic field-effect transistor circuit.

SUMMARY OF THE INVENTION

According to the present invention, a low-cost and efficient method of fabrication is disclosed that can produce self-aligned vias in dielectric polymer films that provides electrical connection between a top conductor and a bottom conductor.

The process is achieved by printing conductive posts on the first patterned conductive layer, followed by the deposition of an unpatterned layer dielectric, followed by the deposition of a second patterned conductive layer.

In one embodiment, the via is formed during the flash annealing of the post after the dielectric is deposited, but before the second conductive layer is deposited. In this process, the post material is annealed with a flash of light, resulting in a release of energy which removes the dielectric on the top of the post.

In another embodiment, the post material is chosen so that a volatile reaction causes the dielectric to be removed during the anneal of the post material. In this case, the post material is not cured or only partially cured before the dielectric deposition.

In yet another embodiment, these conductive posts are chosen to include materials which repel the dielectric material. In this embodiment, the post material may be cured, partially cured, or not cured before the dielectric, the process chosen to maximize the repelling properties of the dielectric material to the post material.

Materials particularly appropriate as a choice of post material are nano-particle conductive inks. The dielectric material is typically annealed at the curing temperature of the nano-particle ink.

The method of the present invention can be generally used for creating via holes in most polymer thin films.

BRIEF DESCRIPTION OF THE DRAWINGS

The present invention is illustrated by way of example and not by limitation in the accompanying figures in which like reference numerals indicate similar elements and in which:

FIGS. 2-4 and 9-11 are sequential process steps for forming vias in a printed organic FET circuit according to the present invention wherein:

FIG. 2 illustrates a cross-sectional view of a process step wherein the source drain conductor is deposited on a substrate with defined source drain electrodes to give a partially processed substrate;

FIG. 3 illustrates a cross-sectional view of a next process step wherein the semiconductor is deposited and annealed;

FIG. 4 illustrates a cross-sectional view of a next process wherein the nano-particle ink is deposited;

FIG. 9 illustrates a cross-sectional view of a next process step wherein the dielectric ink is deposited;

FIG. 10 illustrates a cross-sectional view of a next process step wherein the sample is exposed to an optical flash;

FIG. 11 illustrates a cross-sectional view of a next process step wherein the gate conductor is deposited;

FIGS. 12-18 illustrates a cross sectional view of sequential steps to fabricate a bottom gate transistor according to the present invention, wherein:

FIG. 12 illustrates the initial steps to form a bottom gate transistor wherein the gate layer and the via post is deposited;

FIG. 13 illustrates the next step in forming a bottom gate transistor wherein the dielectric is deposited;

FIG. 14 illustrates a cross sectional view whereby the via openings are formed in a bottom gate device;

FIG. 15 illustrates a cross sectional view whereby the semiconductor is deposited in the formation of a top contact bottom gate device;

FIG. 16 illustrates a cross sectional view whereby the via opening is formed through the semiconductor on a top contact bottom gate device;

FIG. 17 illustrates a cross sectional view whereby the source and drain are deposited on a top gate bottom gate device; and FIG. 18 illustrates a cross sectional view whereby the semiconductor and source/drain layers are deposited to form a bottom contact bottom gate device.

DETAILED DESCRIPTION

The via formation according to the present invention is described with respect to the fabrication of a top gate organic transistor in FIGS. 2-4 and 9-11 and with respect to the fabrication of a bottom gate organic transistor in FIGS. 12-18.

Figure 1:
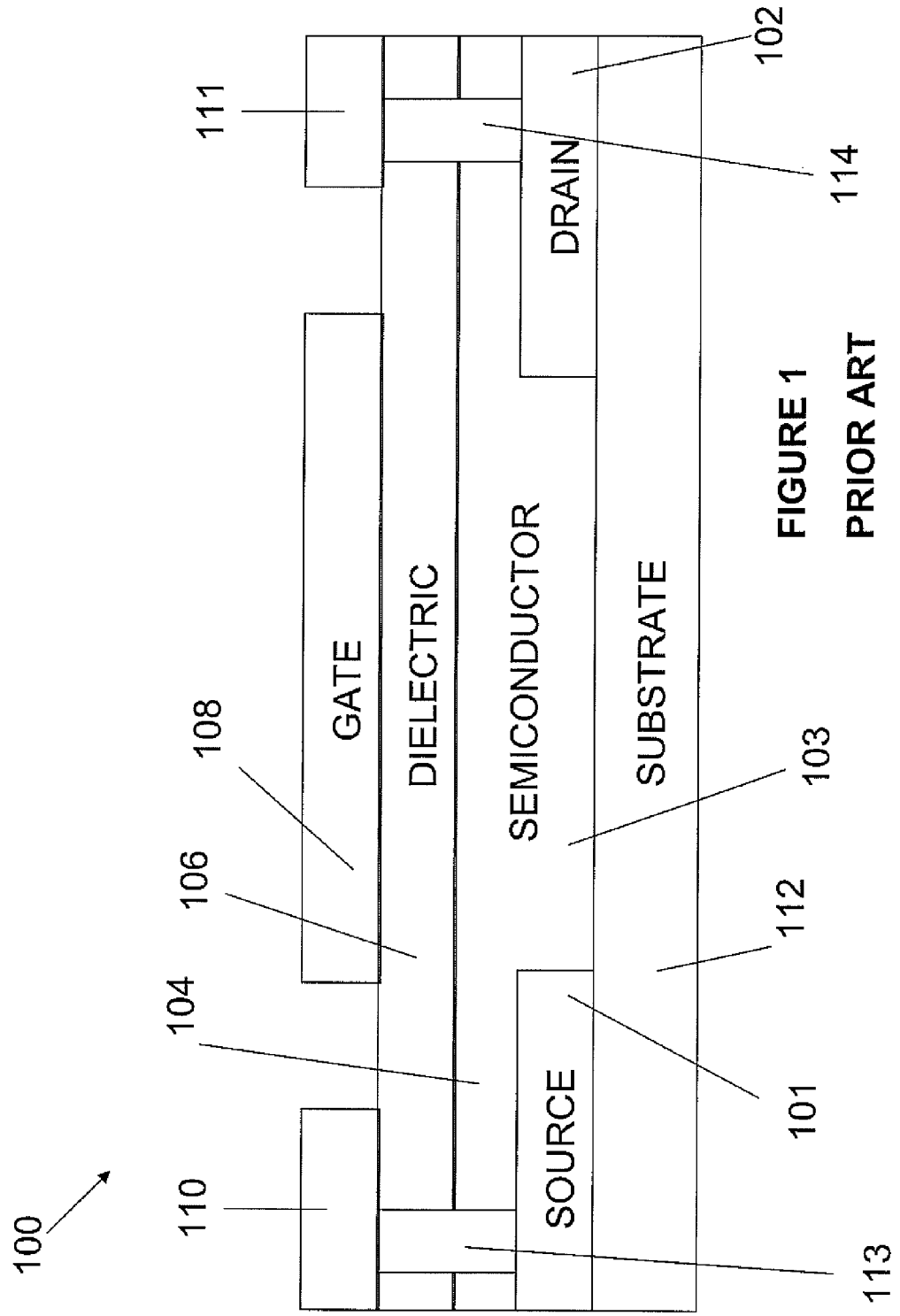
FIG. 1 illustrates a cross-sectional view of an organic FET transistor including an insulating substrate, organic polymer film, dielectric layer, vias and conductive gate according to the prior art.
Figure 2:
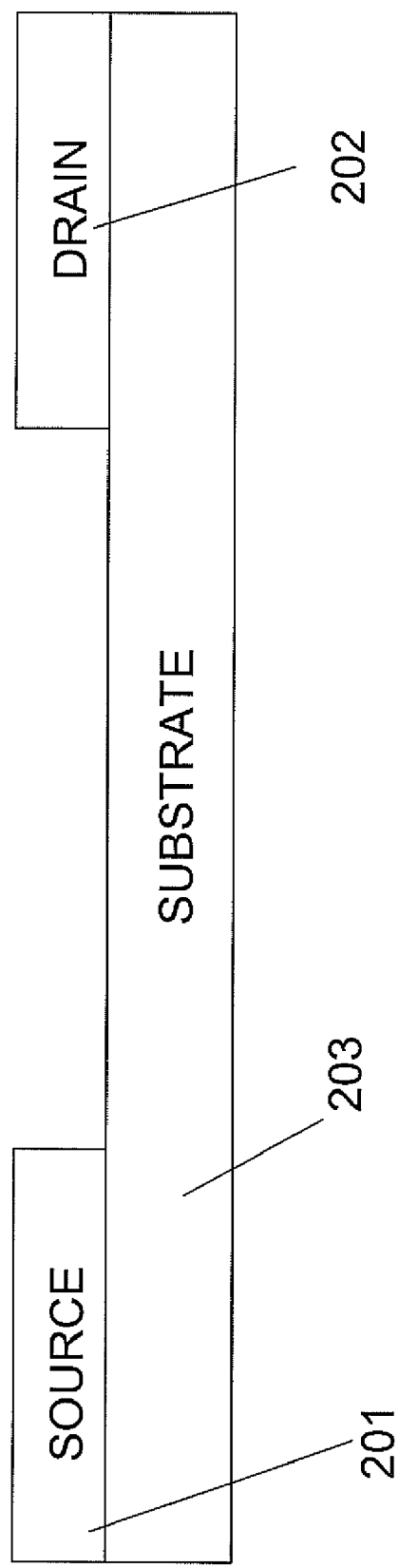

Referring now to FIG. 2, a source and drain conductor, 201 and 202, respectively, is patterned on insulating substrate 203. The source/drain conductor can be of any material that conducts electricity, including metals, conducting polymers, or nano-particle ink. The preferred deposition means depends on the material, including sublimation and evaporation of a solid source, or deposition by means of a liquid. Patterning can be achieved through a shadow mask, by directly depositing the pattern of interest, or by means of a deposition followed by removal of unwanted materials. The substrate must be electrically insulating, consisting of either flexible or rigid material. Flexible substrate materials include PET, PEN, Kapton, mylar, and paper. Rigid materials include silicon with silicon dioxide, sapphire, or other insulating materials.

Figure 3:
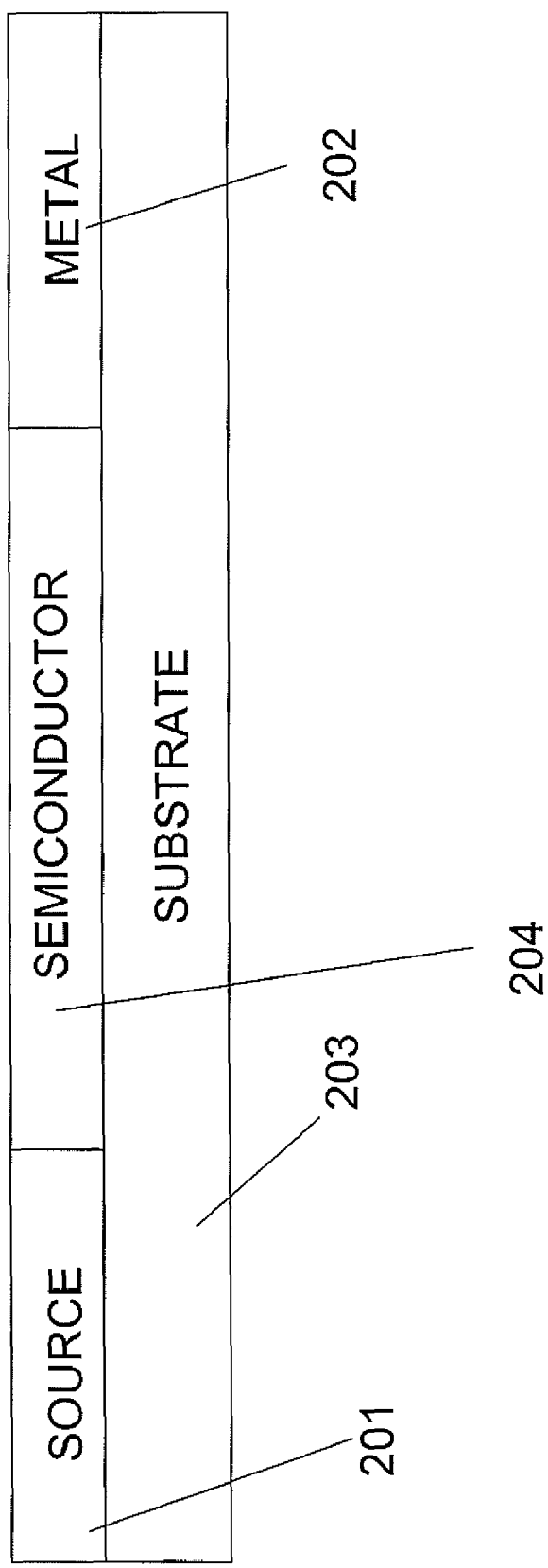

Referring now to FIG. 3, semiconductor 204 is deposited between the source and drain 201, 202 and the substrate 203. The semiconductor may also be applied in other areas of the circuit, but must at a minimum exist in the channel region between source 201 and drain 202. The semiconductor material includes any material exhibiting semiconductor properties, including organic compounds such as polythiophene, pentacene and inorganic materials such as silicon. In another embodiment, the semiconductor overlaps the top of the source and the drain, partially or entirely. In yet another embodiment, the semiconductor is not patterned at all, but rather deposited as a layer over the entirety of the circuit.

Figure 4:
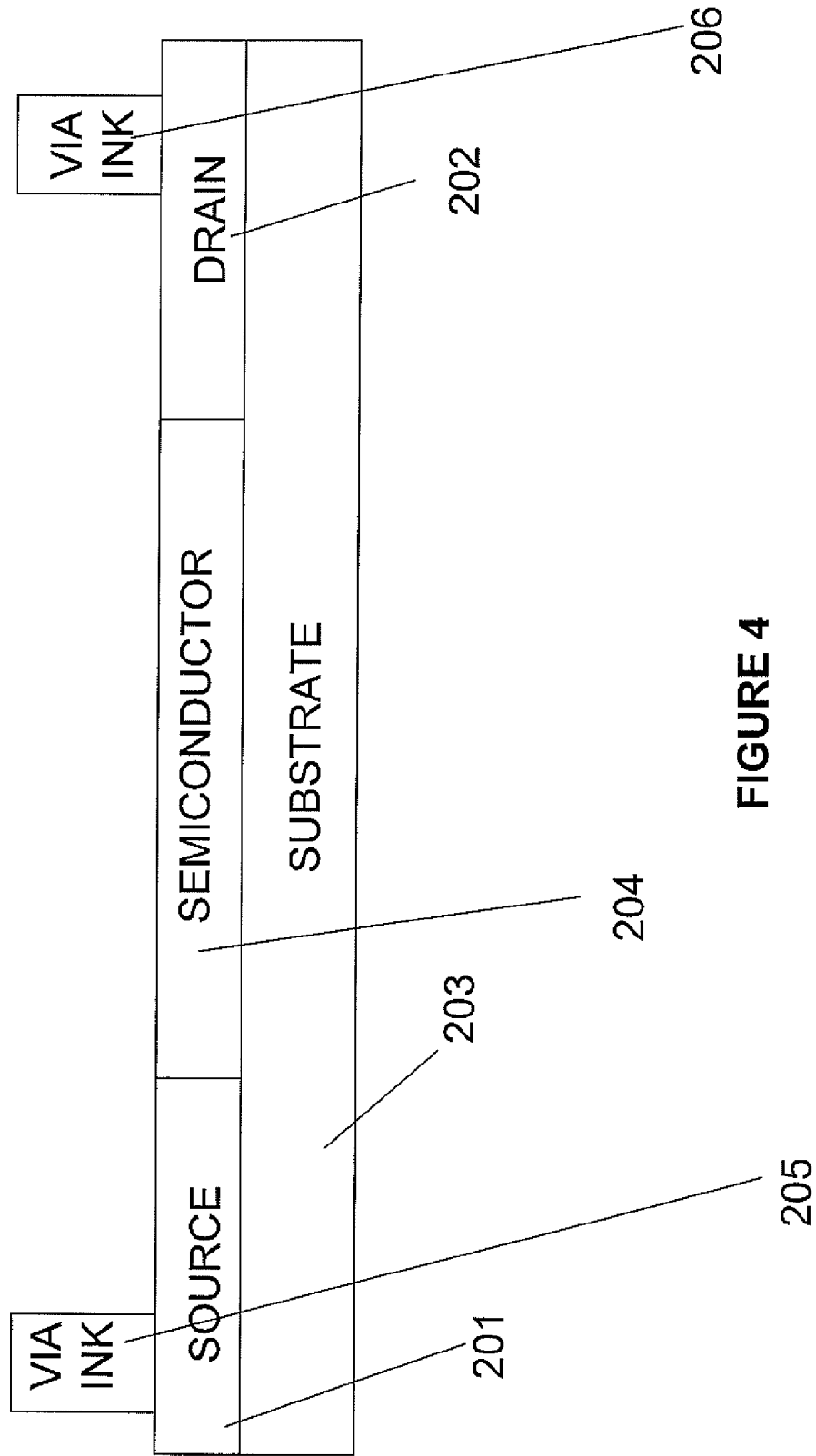

Referring now to FIG. 4, conductive posts 205 and 206 are deposited on the source 201 and the drain 202. Posts 205 and 206 are placed on the source and drain where an electrical connection is required by circuit design to subsequent conductive layers. It is not necessary that every source and drain require such a connection. Such connections can also be made on conductive traces which are not necessarily used as the source or drain of a transistor.

The conductive posts 205 and 206 can be made of any material, but is preferably chosen to interact appropriately with the subsequently deposited dielectric material. In one embodiment, the post material is chosen so that it will "flash anneal", whereby significant energy is released during the anneal process. This post material may be partially cured at this step or not cured at all. The final anneal process is completed after the dielectric has been deposited.

Figure 5:
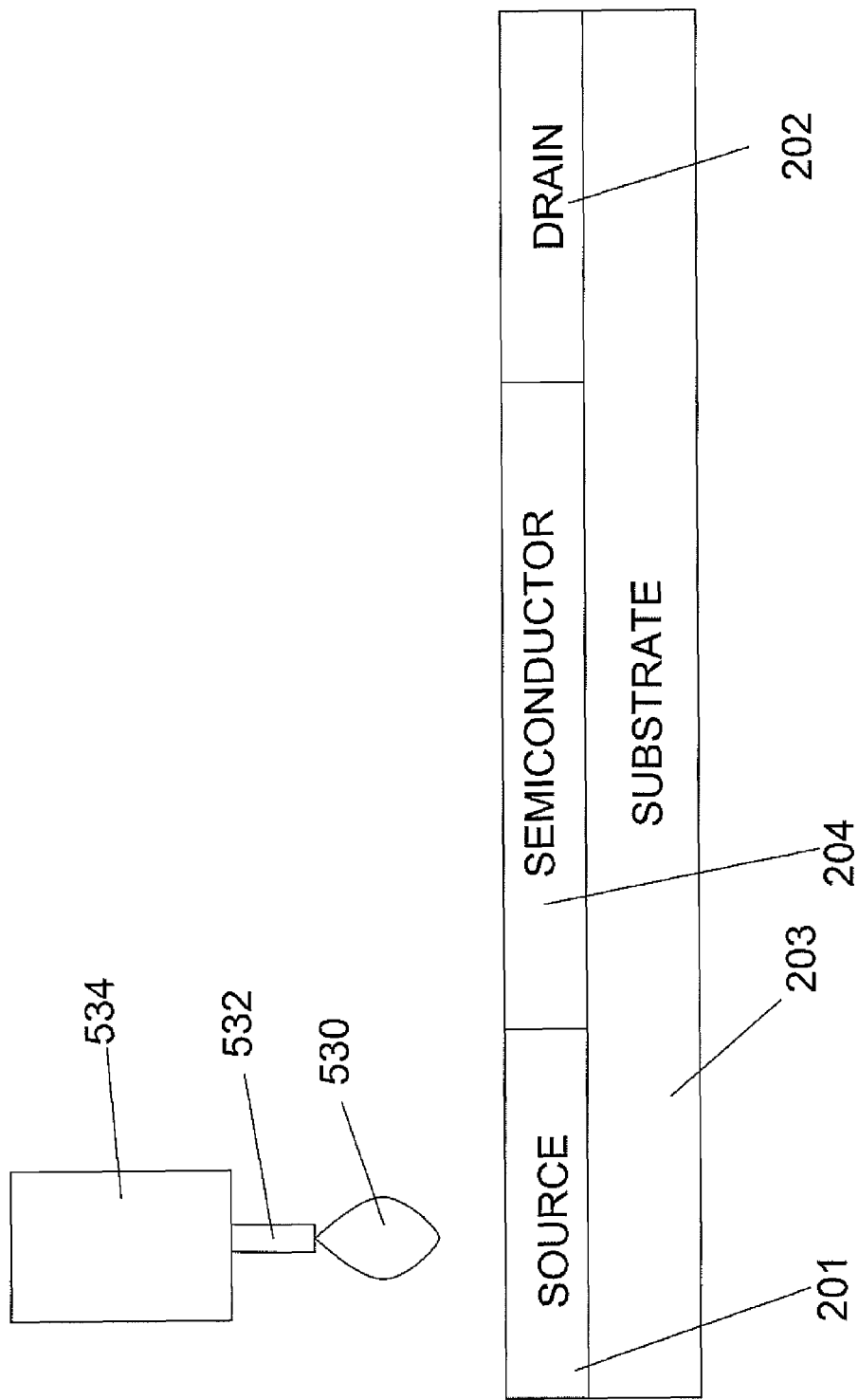
FIG. 5 illustrates posts patterned via inkjet means.

In one embodiment, the posts are deposited by inkjet printer as illustrated in FIG. 5. One or more drops of ink 530 is ejected through nozzle 532 by physically compressing the chamber 534 through mechanisms including contracting a ferroelectric surface. Alternatively, the ink can be expanded in the chamber 534 or the nozzle 532 by thermal means. Properties of the ink, such a viscosity and surface tension, are chosen to form an appropriate structure on the deposition surface.

Figure 6:
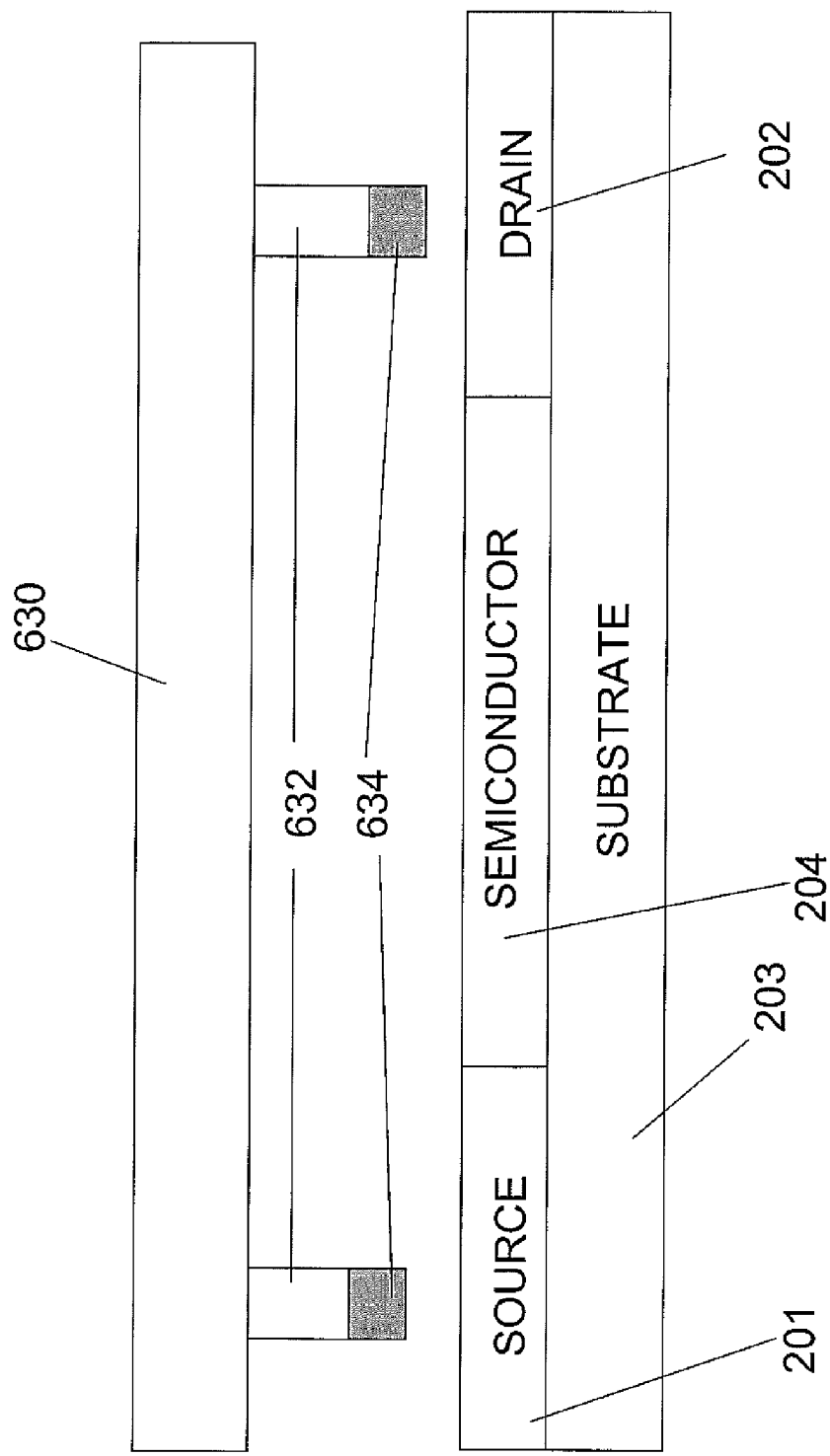
FIG. 6 illustrates posts patterned via flexography.

In another embodiment, the posts are deposited by flexographic means as illustrated in FIG. 6. A raised pattern of posts 632 is formed on a flexographic plate 630. The raised surfaces 632 are covered with ink 634, and are aligned and placed in contact with the areas where the posts are to be printed, thereby transferring the ink 634 onto the source and drain 201 and 202. The print plate can be flat or can be placed on a roller wherein a continuous feed of substrate is rolled underneath the roller to form a roll-to-roll print flexographic platform.

Figure 7:
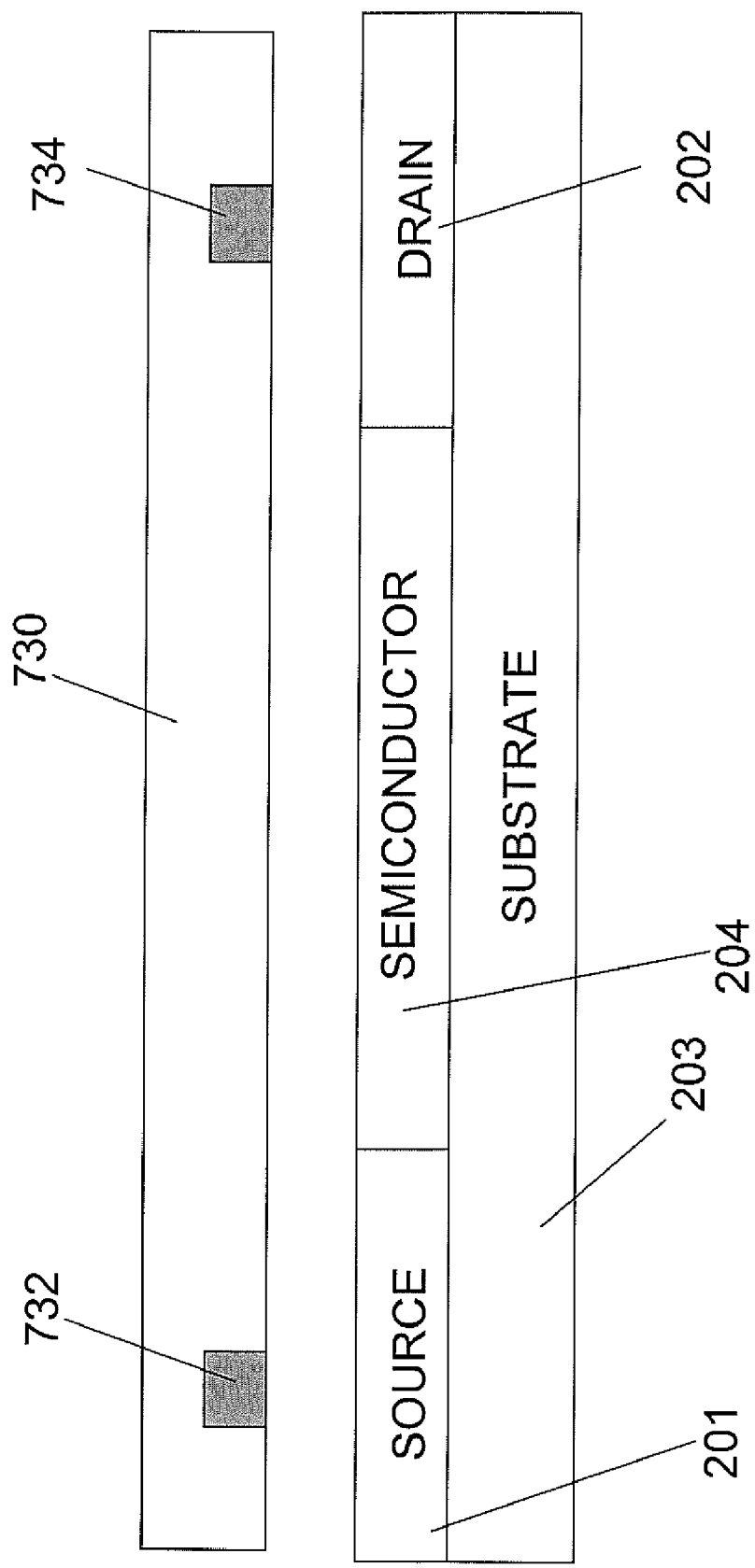
FIG. 7 illustrates posts patterned via gravure.

In another embodiment, the posts are deposited by gravure means as illustrated in FIG. 7. Cavities, also called cells 732 and 734, are formed on gravure plate 730. The plate is submerged in ink and is then scraped clean, thereby leaving ink in cells 732 and 734. The plate is then placed in contact with the area on which the posts are printed, source 201 and drain 202. The ink is then transferred to the surface of the source 201 and drain 202. The gravure plate can be flat, or can be mounted on a roller wherein a continuous feed of substrate is rolled beneath the roller to form a roll-to-roll gravure print process.

Figure 8:
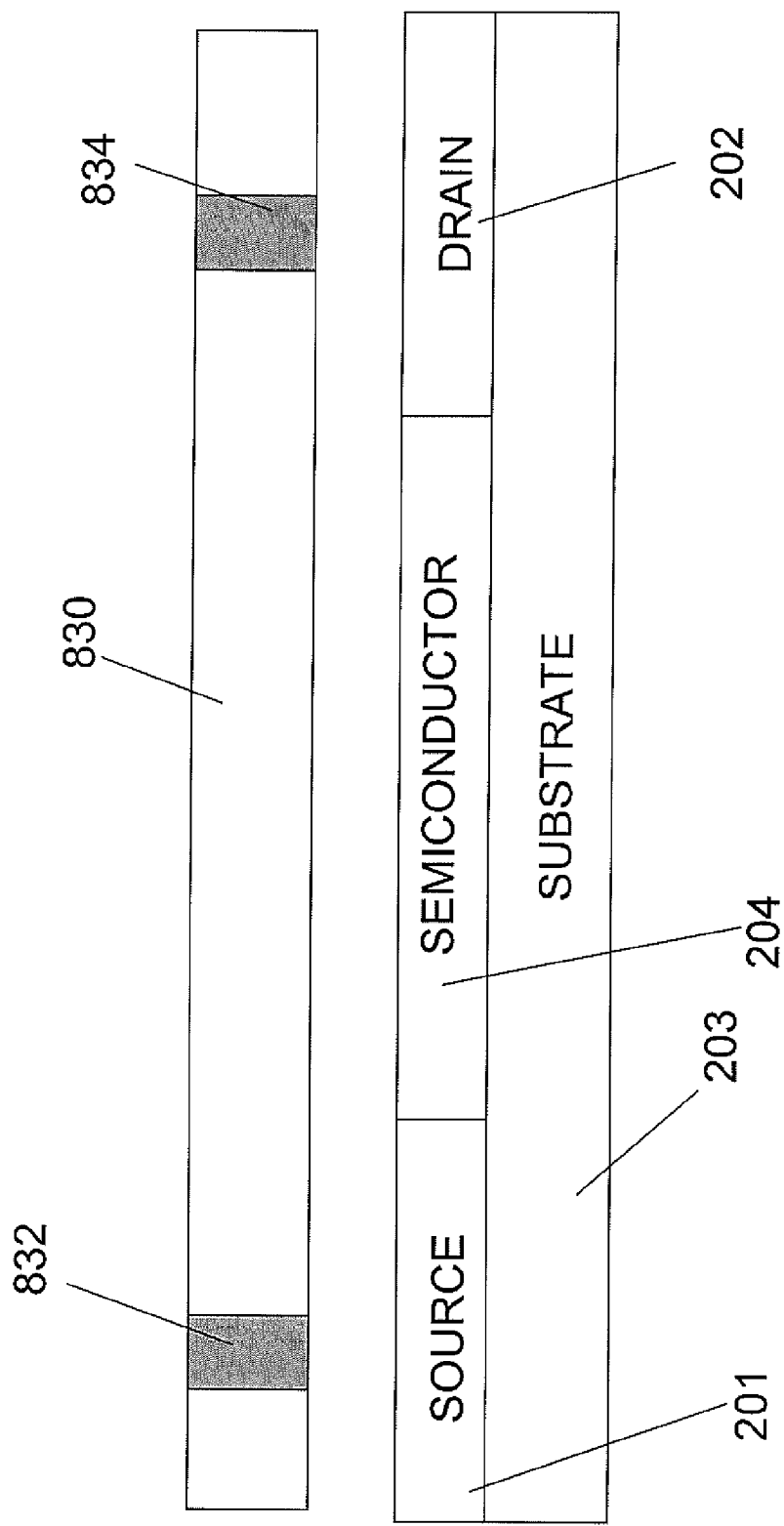
FIG. 8 illustrates posts patterned via screen printing.

In yet another embodiment, the posts are deposited by silk screen means as illustrated in FIG. 8. The locations where posts are to be printed will have openings in a wire or nylon meshed sheet 830. The screen is placed in contact with the surface to be printed, such that the openings 832 and 834 are aligned with the prospective print locations, source 201 and drain 202. The ink is then placed on the top surface of the screen, and pressed through the openings by means of a squeegee on the top surface of the screen plate 830. The screen can also be mounted on a roller, utilizing rotorary screen printing. With rotorary screen printing, a continuous feed of substrate can be printed to form a roll-to-roll screen printing process.

In another embodiment, the post material is chosen so that it will react in a volatile fashion during the anneal. The post material may be partially cured at this step or not cured at all. This is achieved by utilizing a thermally volatile polymer as the post material that tends to volatilize at temperatures higher than a given temperature T. This temperature is achieved during the final anneal process after the dielectric has been deposited.

In yet another embodiment, the post material is chosen so that it will repel the dielectric material. In this case, the post material may be cured at this step, partially cured or not at all. The appropriate process is chosen to maximize the repelling properties of the dielectric to the post material.

In yet another embodiment, a different sacrificial polymer of a polarity opposite to that of the dielectric is deposited in the via locations over the post material. In that scenario, this polymer causes the dielectric to de-wet and self align the vias. The resulting vias in this case can be filled in by the deposited gate metal after the sacrificial polymer is removed.

Figure 9:
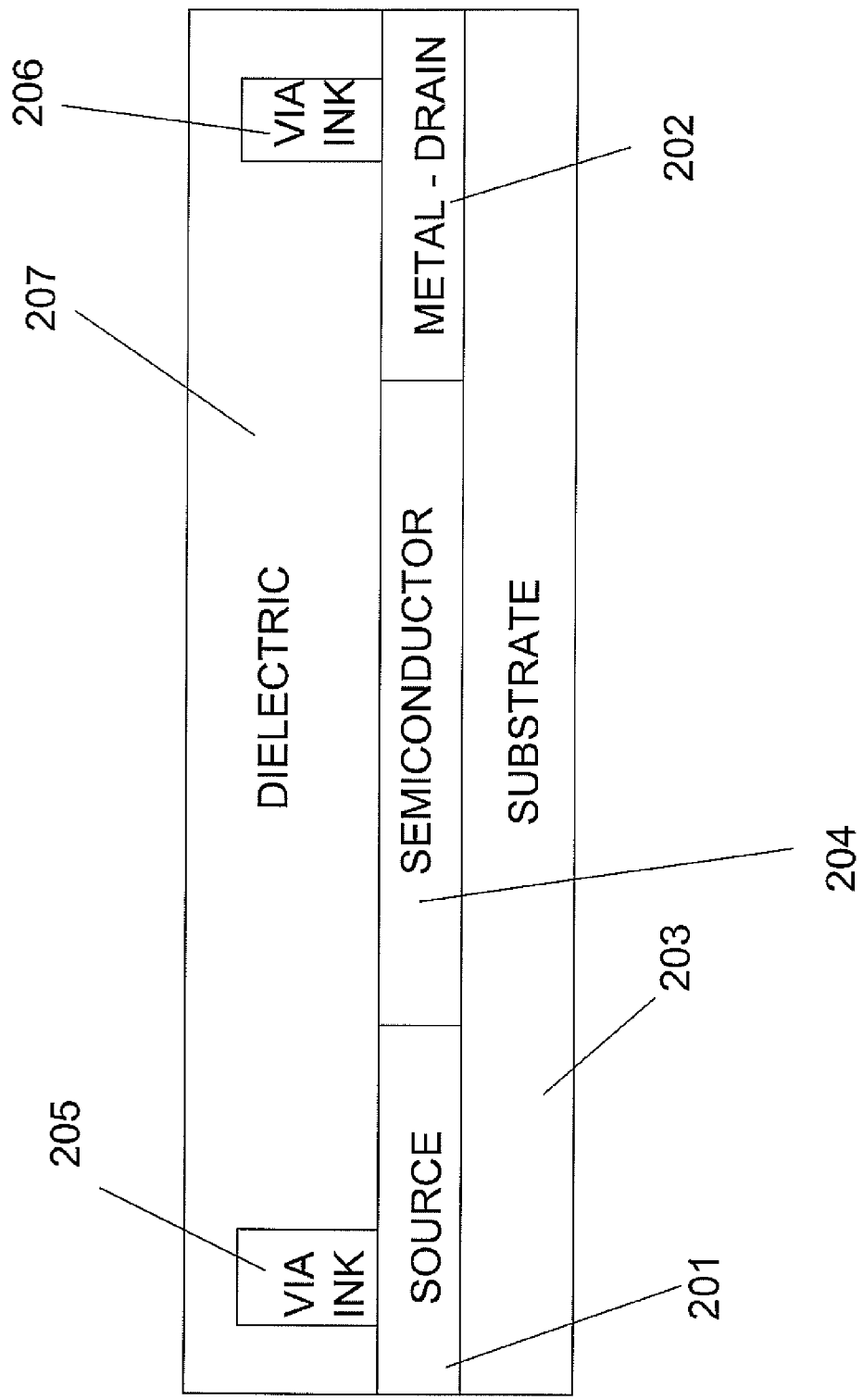

Referring now to FIG. 9, the dielectric ink 207 is deposited. The dielectric will overlap semiconductor 204, source 201 and drain 202 regions, as well as post 205 and 206. This can be accomplished by depositing a patterned dielectric or by coating the entire surface with the dielectric without patterning. In one embodiment, the dielectric covers the top of the posts 205 and 206.

In another embodiment, the height of the dielectric is lower than the height of the posts 205 and 206, thereby leaving the top of the posts exposed. In one embodiment, the dielectric is repelled by the post material, leaving the top of the posts without any dielectric material. This can be achieved if the dielectric solution is hydrophobic, the post material is hydrophilic, or vice versa. This difference in wetting properties causes the dielectric to move away or de-wet from the locations at which it contacts the nano-particle ink and thus allows self alignment of the vias.

Figure 10:
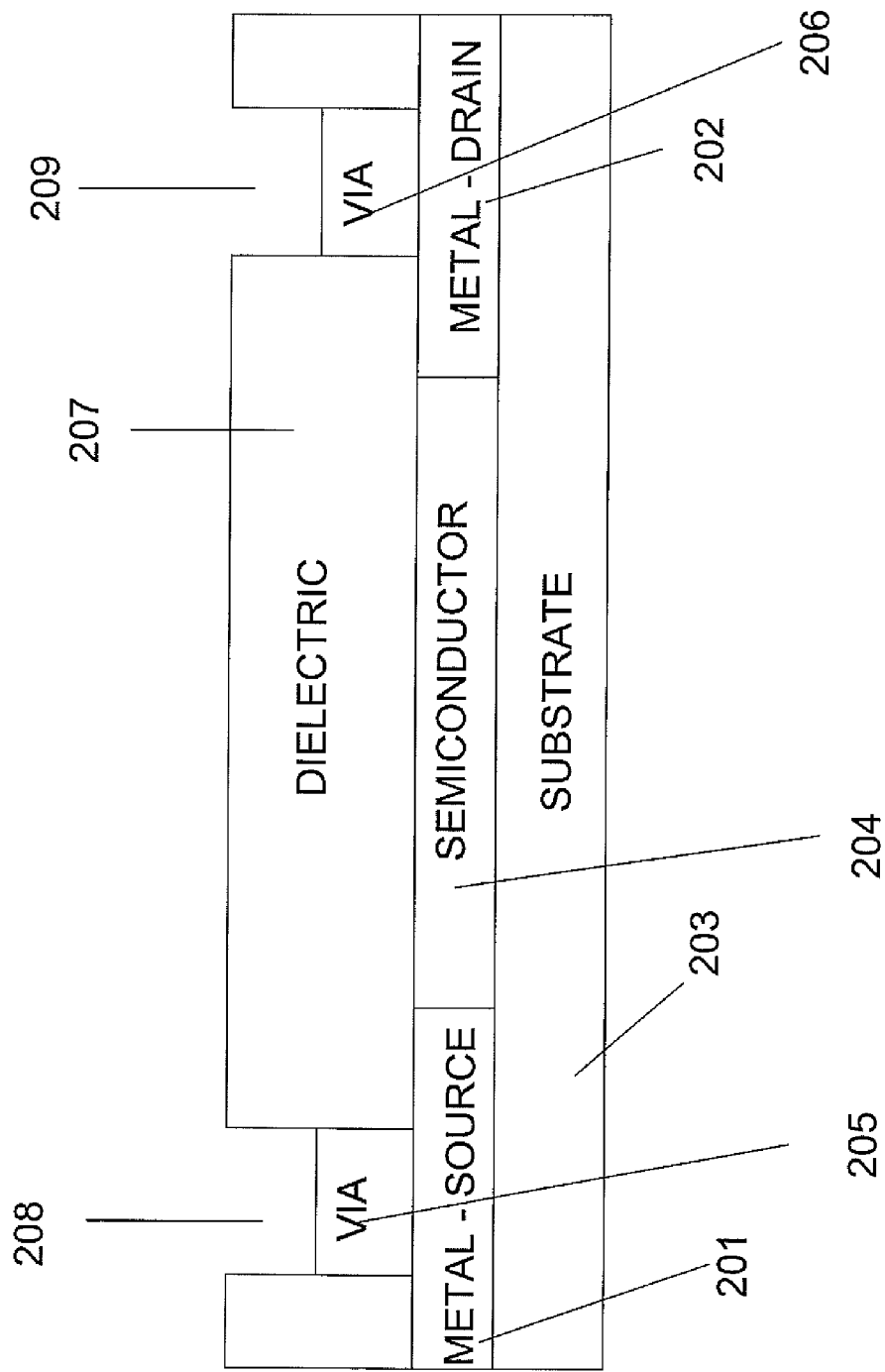

Referring now to FIG. 10, the surface of the dielectric is exposed to light which causes the post material to cure via "flash anneal". In this embodiment, the process releases energy which causes remaining dielectric 208 and 209 on top of the post 205 and 206 to be removed, thereby exposing the top of the posts. Alternatively, this flash anneal is made through the bottom of the substrate in cases where the flash radiation can pass through the substrate material.

In another embodiment, the post material is annealed thermally or by rapid thermal anneal, whereby the dielectric material is removed from the top of the post through a volatile reaction.

In yet another embodiment, the post material repels the dielectric material, thereby leaving the top of the post without dielectric. If the post material was not completely annealed earlier, the anneal process can be completed at this stage.

In yet another embodiment, the anneal performed for the sake of the post material also serves to anneal the dielectric material.

Figure 11:
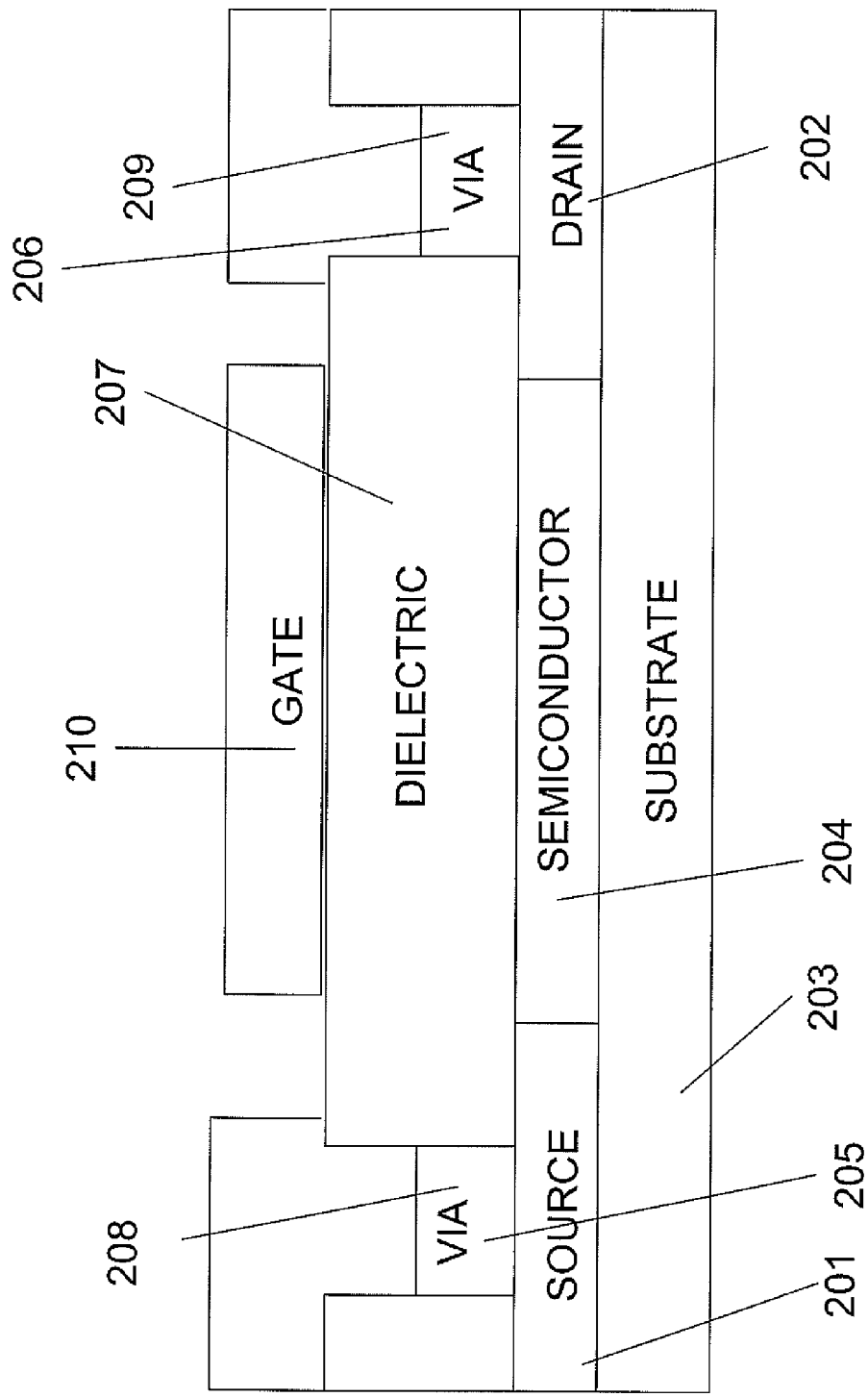

Referring now to FIG. 11, the gate conductor 210 is deposited, patterned, and annealed to complete the circuit fabrication. In order to form a gate of a transistor, conductive layer 210 must overlap the channel region between source 201 and drain 202. Conductive layer 210 may also be patterned to correspond to the gate of another transistor, or may be used as a conductive interconnect or to provide the conductive means on that layer for any purpose.

The gate conductor includes any conducting material, including metal, conducting nano-particles, or conducting polymer. Patterning is achieved either by depositing a solution or ink in the patterned fashion using print technology such as gravure, inkjet, flexography, or silk screening. Alternatively, the gate metal can be patterned using a shadow mask during deposition, or subsequently removing unwanted material via a photo resist process.

The area 208 and 209 above posts 205 and 206 have no dielectric or semiconductor over it since it has been removed by the methods described above. Therefore, where the conductive layer 210 makes contact to a post 205 or 206, an electrical connection is made between the first source/drain conductive layer and the second gate layer conductor through the materials between them. Though the primary purpose of the source/drain conductive layer is to define the source/drain of a transistor and the primary purpose of the gate conductive layer is to define the gate layer, either layer can pattern metal for any other purpose such as the creation of a capacitor, resistor, inductor, or as an interconnect.

Figure 12:
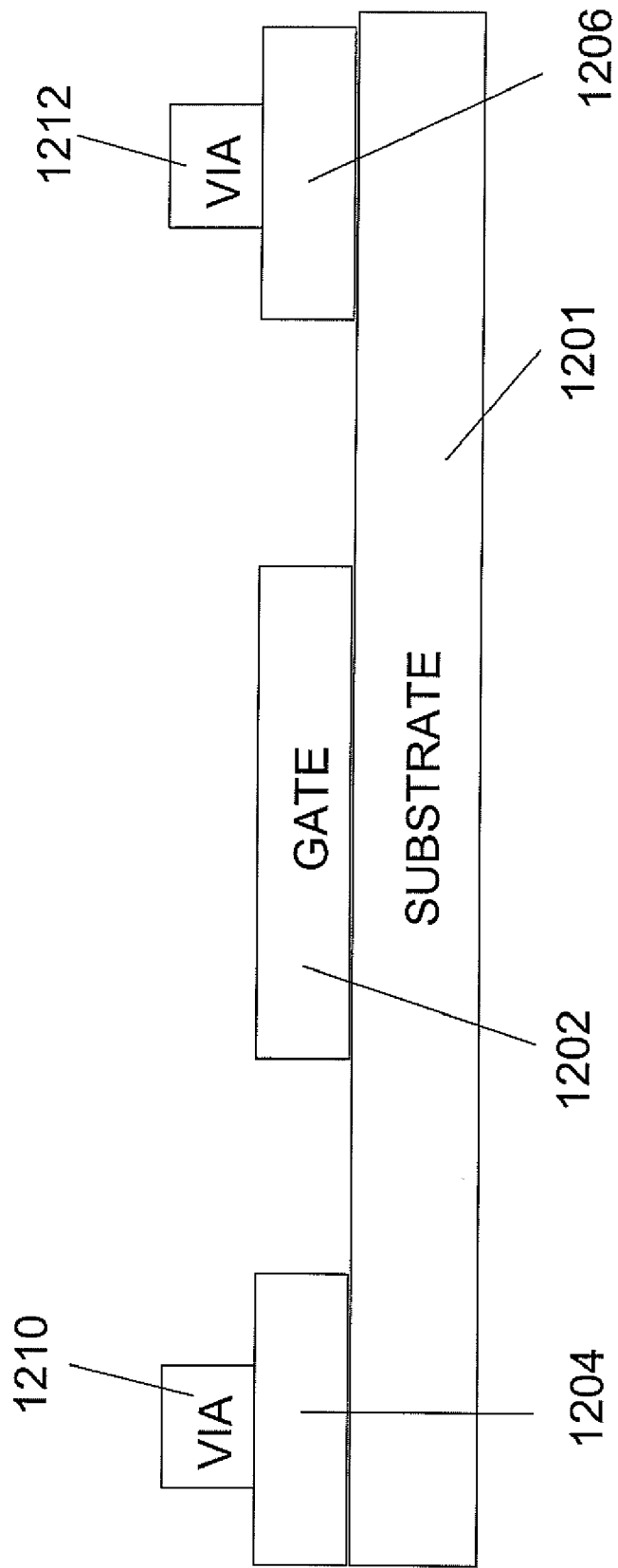

The same via formation method according to the present invention can also be used in a bottom gate construction as illustrated in FIG. 12. A patterned conductive layer including gate conductor 1202 and conductive regions 1204 and 1206 are formed on substrate 1201. This pattern can be obtained by depositing a fluid conductor directly on substrate 1201, by evaporating a conductive solid through a shadow mask, or by first covering the entire substrate with the conductive layer followed by selective removal. The conductive gate material can include any conductive substance including metal, conductive polymer, or nano-particle metal ink solution.

The posts are then deposited on the surfaces 1204 and 1206 using any of the same methods described above, to form via 1210 and 1212.

Figure 13:
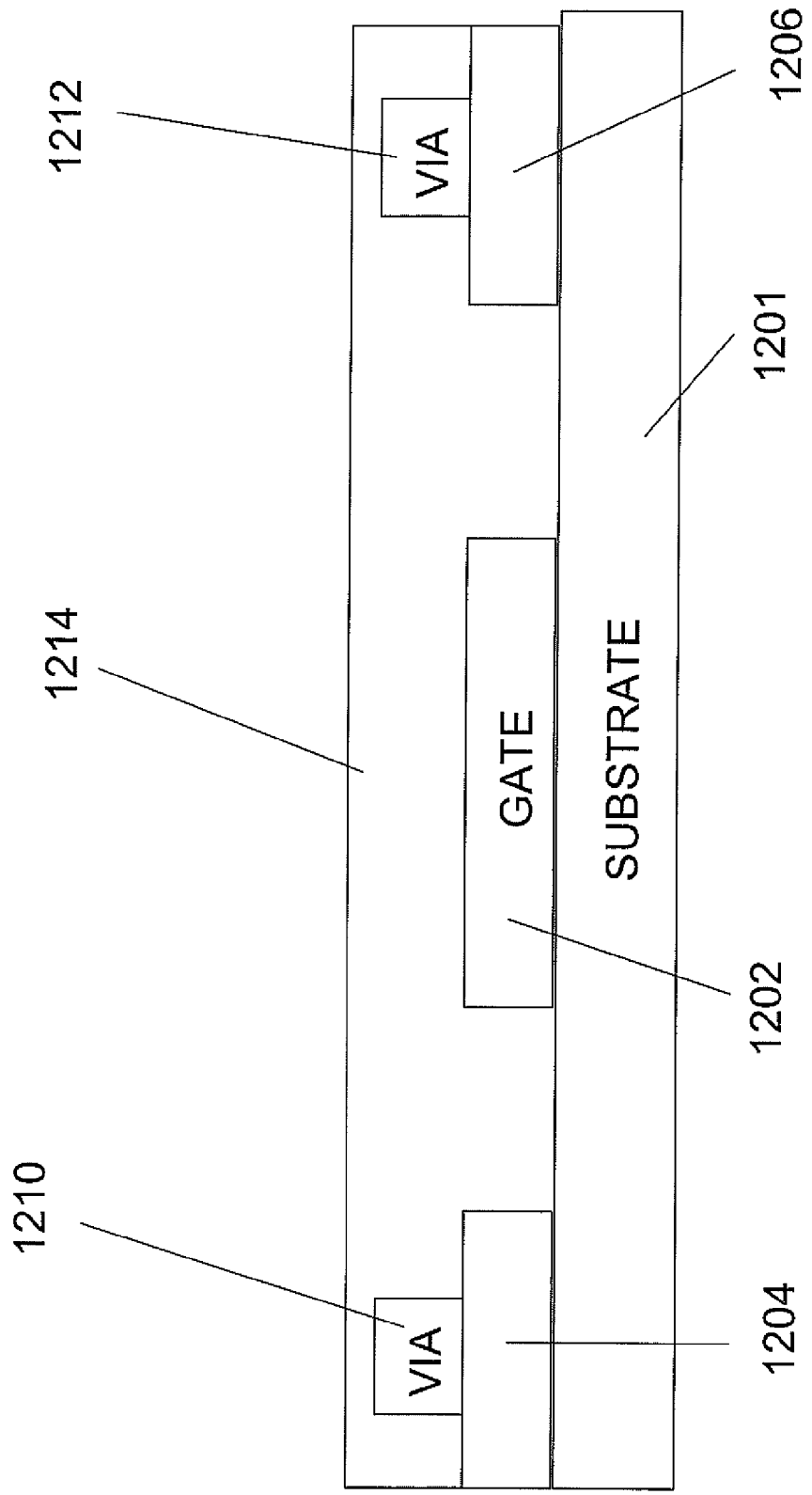

Referring now to FIG. 13, the dielectric 1214 is deposited over vias 1210 and 1212. The dielectric 1214 could cover the entire area, as shown in FIG. 13. Alternatively, the dielectric 1214 could be deposited in a pattern wherein at minimum all conductive regions on the gate layer are covered. The areas between conductive regions can also be covered, but can be left uncovered if so desired.

Figure 14:
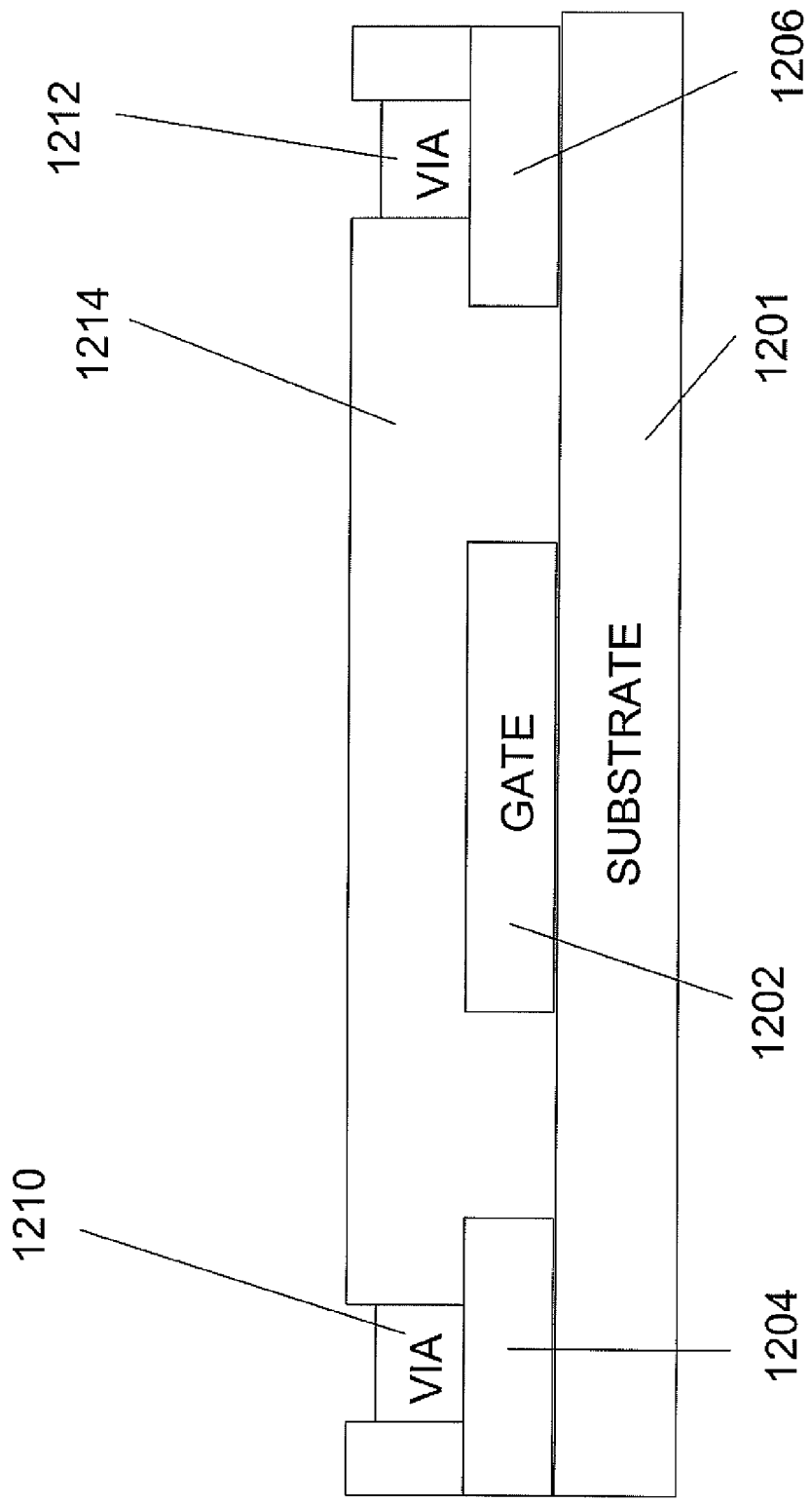

As illustrated in FIG. 14, the via metal openings are now formed by flash light anneal, or thermal anneal by methods as described above, the energy release of which remove the dielectric above the via post.

Figure 15:
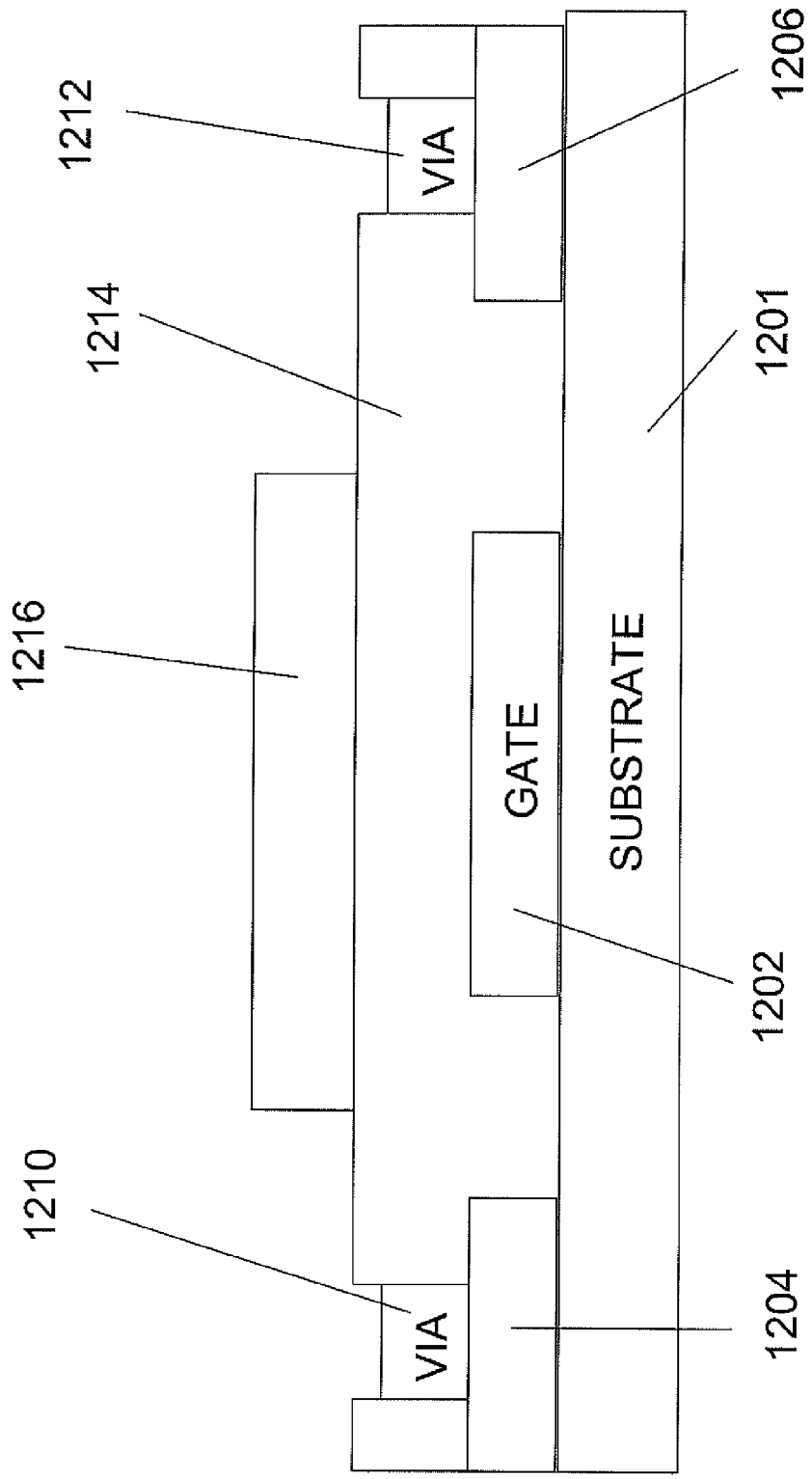

In FIG. 15, a semiconductor layer 1216 is formed over the dielectric layer 1214, as shown. In another embodiment, the semiconductor layer 1216 can be formed prior to forming the via openings. In either case, the semiconductor 1216 must overlap all areas that make up the gate of the transistor.

Figure 16:
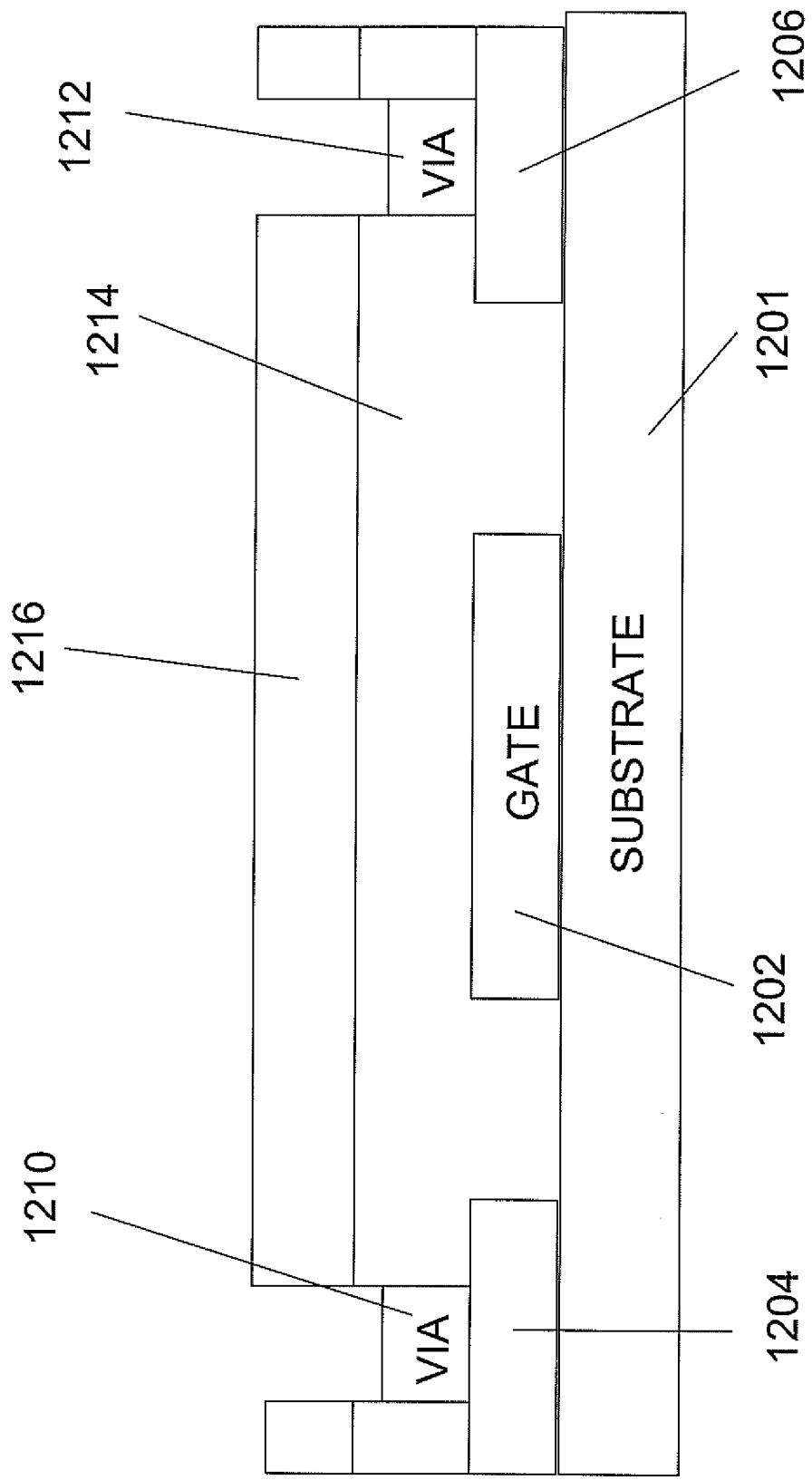

The semiconductor 1216 may or may not be placed in areas other than the gate conductor, including over the via regions. The semiconductor 1216 may cover the entire surface area. As illustrated in FIG. 16, methods described above to open vias 1210 and 1212 can be used to open the dielectric and semiconductor over the via.

Figure 17:
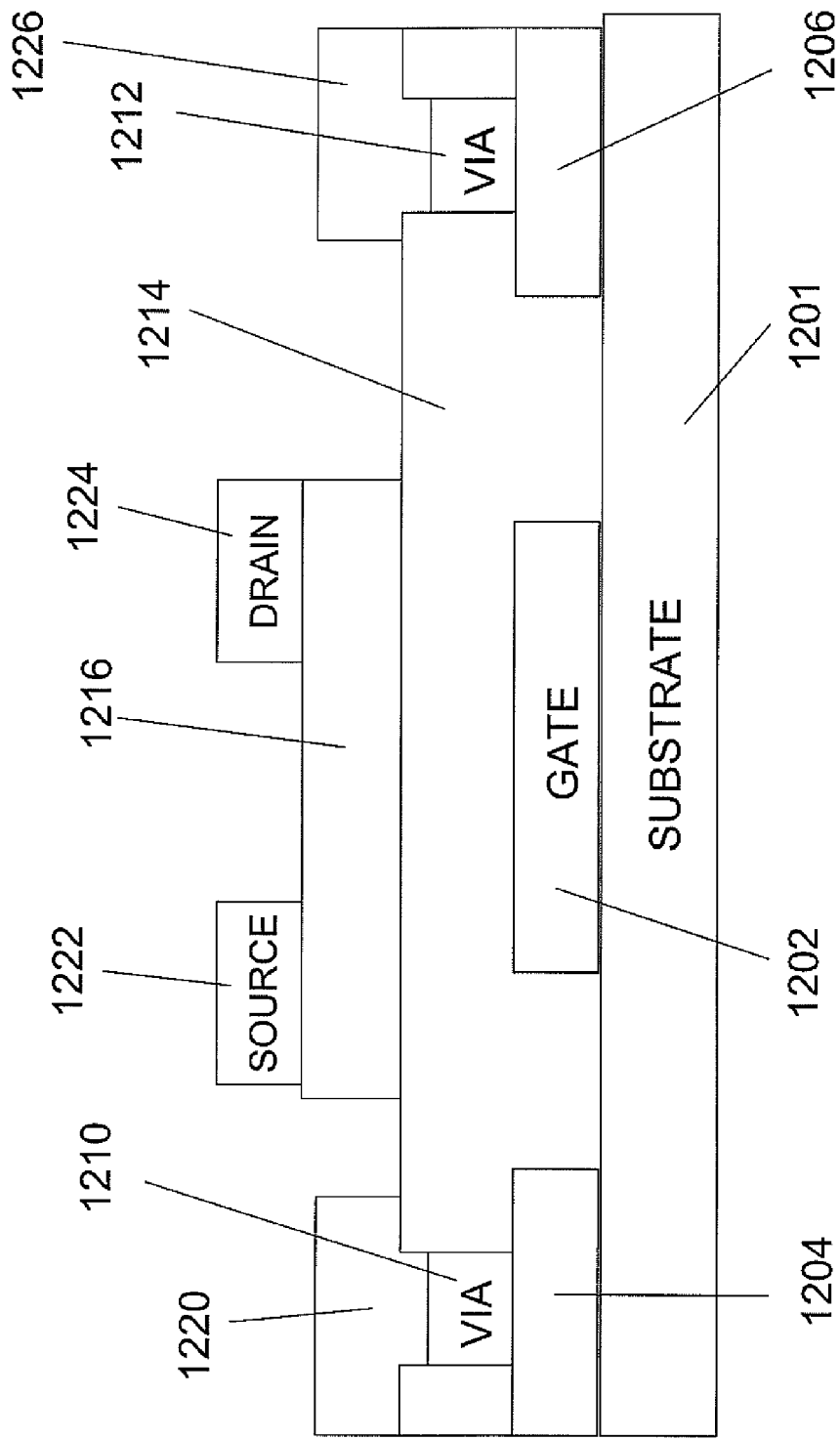

In one embodiment, a "top contact bottom gate" structure is formed by depositing semiconductor 1216 before a conductive source/drain layer to form source 1222, drain 1224, and conductive regions 1220 and 1226, as illustrated in FIG. 17. Conductive regions 1220 and 1226 represent conductive interconnect that is routed to other areas of the chip for appropriate electrical contact. At least a portion of source 1222 and drain 1224 must overlap the gate 1202 in order to form a transistor. The area between source 1222 and 1224 is the channel region of the transistor, which must be entirely overlapped by the gate.

Figure 18:
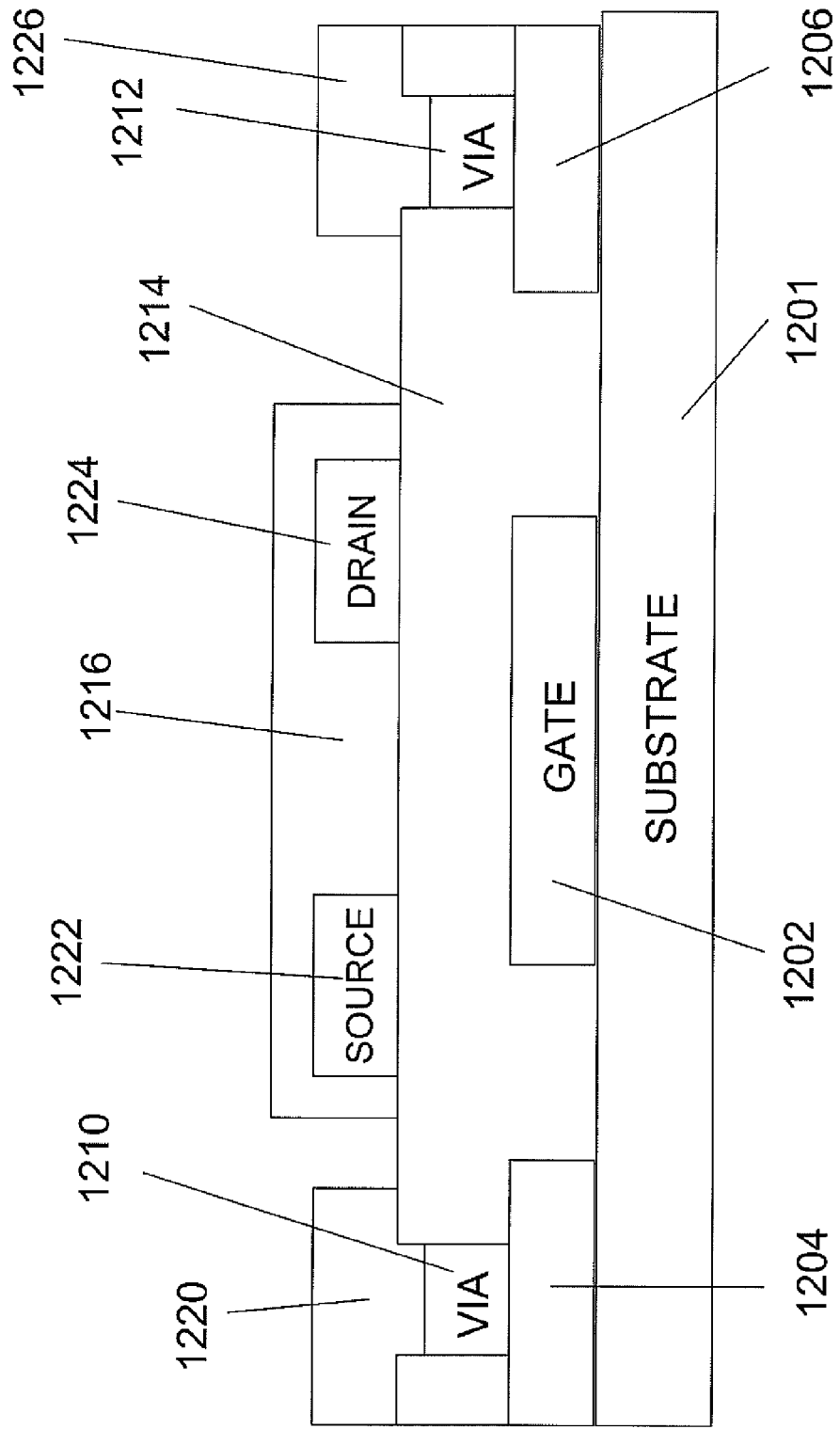

In another embodiment illustrated in FIG. 18, a "bottom contact top gate" structure is formed by depositing the semiconductor after the patterned gate layer is defined. In this structure, the space between the source 1222 and the drain 1224 establishes the channel region. The channel region must be completely overlapped by the gate 1202. The semiconductor 1216, at a minimum must cover the entire channel region. Alternatively, the semiconductor may cover the source 1222 and drain 1224, and may cover any other areas. The semiconductor layer 1216 can even be applied without patterning at all. In this case, the via opening techniques described above will break an opening through the dielectric and semiconductor sandwich.

While the invention has been described in detail in the foregoing description and illustrative embodiment, it will be appreciated by those skilled in the art that many variations may be made without departing from the spirit and scope of the invention. Thus, it may be understood, for example, that the structures above could include a variety of different nanoparticles, polymers and various print methodologies can be used to achieve this result. The process may also include surface treatments at various steps as well as modified transistor structures, including structures such as top-gate top-electrode, top-gate bottom-electrode, bottom gate top-electrode, bottom gate bottom electrode and vertical FETs.

We claim:

1. A method for forming a self-aligned via in a dielectric layer to provide electrical contact between a first conductive layer and a second conductive layer, the method comprising the steps of:
   (a) providing a substrate comprising the first metal layer, a post formed from a conductive post material, and the dielectric layer, wherein the post abuts the first metal layer, and wherein the dielectric layer covers the post and at least a portion of the first metal layer;
   (b) removing dielectric material from a top surface of the post by annealing the post; and
   (c) forming the second conductive layer abutting the top surface of the post.

2. The method of claim 1, further comprising fabricating a top gate organic transistor, where the first conductive layer is used as a source/drain of the transistor and the second conductive layer is used as a gate of the transistor.

3. The method of claim 1, further comprising fabricate a bottom gate organic transistor, where the first conductive layer is used as a gate of the transistor and the second conductive layer is used as a source/drain of the transistor.

4. The method of claim 1, wherein the dielectric layer is deposited without patterning.

5. The method of claim 1, wherein the post material is a fluid placed by printing means.

6. The method of claim 1, wherein the post material is a fluid placed by inkjet printing, flexography, gravure, or screen printing.

7. The method of claim 1, wherein a height of the dielectric is lower than a height of the post.

8. The method of claim 1, wherein removing dielectric material from the top surface of the post compromises flash annealing the post material.

9. The method of claim 1, wherein removing the dielectric material from the top surface of the post comprises thermally annealing the post material.

10. The method of claim 1, further comprising removing a hydrophobic dielectric material on the top surface of the post by using hydrophilic post materials.

11. The method of claim 1, further comprising removing a hydrophilic dielectric material on the top surface of the post by using hydrophobic post materials.

12. The method of claim 1, further comprising covering the post with a sacrificial polymer.

13. A method of forming vias in a printed organic FET circuit comprising:
   providing first metal layer;
   forming ink posts on the surface of the first metal layer;
   forming a dielectric layer over the ink posts whereby the posts are embedded in the dielectric layer;
   annealing the ink posts to expose a top surface of the inks posts; and
   depositing a second metal layer over the dielectric layer to provide a conductive path from the second metal layer to the first metal layer through the annealed ink posts.

14. The method of claim 13, wherein annealing the ink posts comprises a method selected from the group consisting of flash annealing and thermal annealing.

* * * * *